United States Patent
Lee et al.

(10) Patent No.: US 7,142,457 B2
(45) Date of Patent: Nov. 28, 2006

(54) NON-VOLATILE SEMICONDUCTOR MEMORY DEVICE

(75) Inventors: Seung-Won Lee, Gyeonggi-do (KR); Seung-Keun Lee, Gyeonggi-do (KR)

(73) Assignee: Samsung Electronics Co., Ltd., Swuon-si (KR)

( * ) Notice: Subject to any disclaimer, the term of this patent is extended or adjusted under 35 U.S.C. 154(b) by 0 days.

(21) Appl. No.: 11/327,045

(22) Filed: Jan. 6, 2006

(65) Prior Publication Data

US 2006/0114738 A1 Jun. 1, 2006

Related U.S. Application Data

(63) Continuation of application No. 10/922,122, filed on Aug. 18, 2004, now Pat. No. 7,016,232.

(30) Foreign Application Priority Data

Aug. 19, 2003 (KR) ............... 2003-57247

(51) Int. Cl.
*G11C 16/26* (2006.01)
(52) U.S. Cl. ............... 365/185.21; 365/204; 365/207
(58) Field of Classification Search ........... 365/185.21, 365/63, 204, 207; 327/51–97
See application file for complete search history.

(56) References Cited

U.S. PATENT DOCUMENTS

| | | | |
|---|---|---|---|
| 5,351,212 A | 9/1994 | Hashimoto | |
| 5,673,223 A | 9/1997 | Park | |
| 5,889,702 A | 3/1999 | Gaultier et al. | |
| 5,936,888 A * | 8/1999 | Sugawara | 365/185.2 |
| 6,108,259 A | 8/2000 | Choi et al. | |
| 6,122,188 A | 9/2000 | Kim et al. | |
| 6,191,979 B1 | 2/2001 | Uekubo | |
| 6,563,737 B1 * | 5/2003 | Khouri et al. | 365/185.21 |
| 7,016,232 B1 * | 3/2006 | Lee et al. | 365/185.21 |
| 2002/0024864 A1 | 2/2002 | Sudo et al. | |

FOREIGN PATENT DOCUMENTS

| | | |
|---|---|---|
| JP | 10-050079 | 2/1998 |
| JP | 2000-268593 | 9/2000 |
| KR | 2003-0001608 | 1/2003 |

OTHER PUBLICATIONS

English language Abstract of Korean Patent Publication No. 2003-0001608, Jan. 8, 2003.
English language Abstract of Japanese Patent Publication No. 10-020079, Feb. 20, 1998.
English language Abstract of Japanese Patent Publication No. 2000-268593, Sep. 29, 2000.

* cited by examiner

*Primary Examiner*—Tan T. Nguyen
(74) *Attorney, Agent, or Firm*—Marger Johnson & McCollom, P.C.

(57) ABSTRACT

A memory device in accordance with embodiments of the present invention includes a reference cell array and a plurality of banks. Each of the banks includes memory cells. A plurality of current copier circuits corresponds to the banks, respectively. Each of the current copier circuits copies a reference current flowing through a reference cell array to generate a reference voltage. A plurality of sense blocks correspond to the banks, respectively. Each of the sense blocks includes a plurality of sense amplifiers for sensing data from a corresponding bank in response to the reference voltage from the corresponding current copier circuit. Memory cell lay-out area is reduced, and sense speed is increased.

6 Claims, 11 Drawing Sheets

Fig. 3A
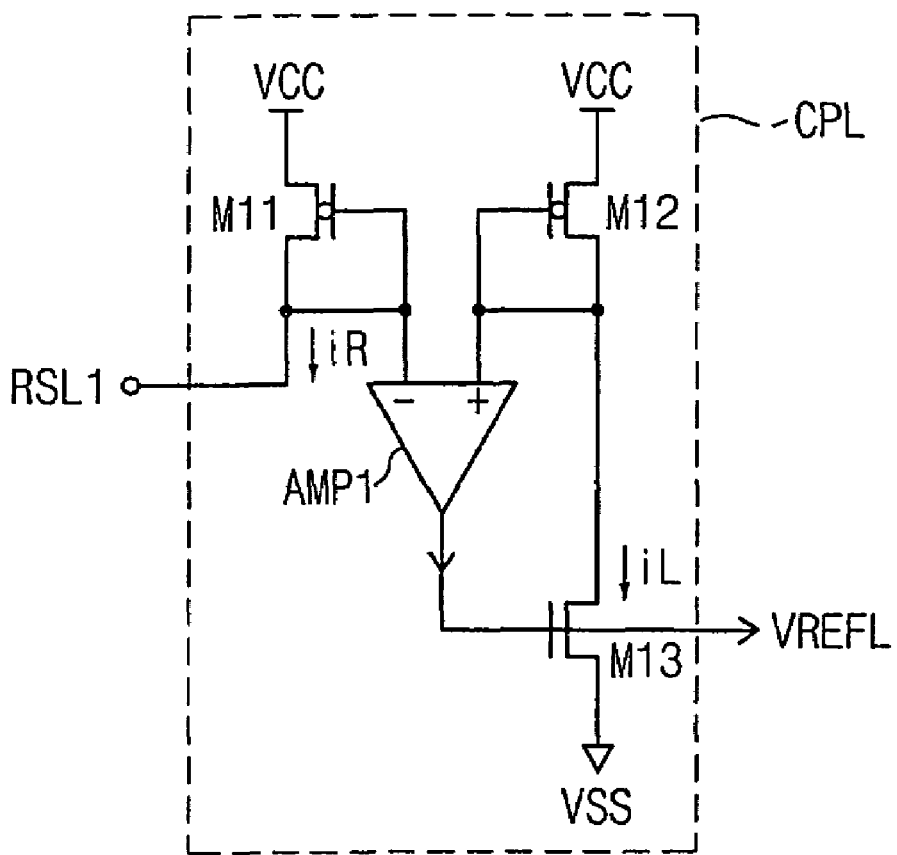

Fig. 3B
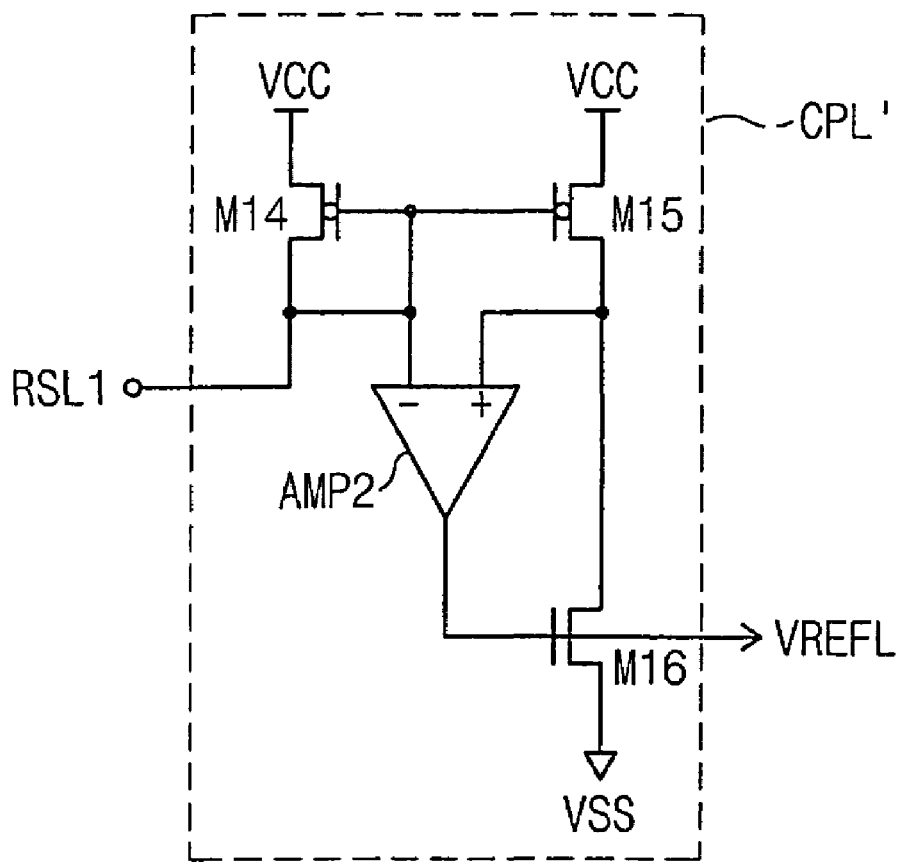
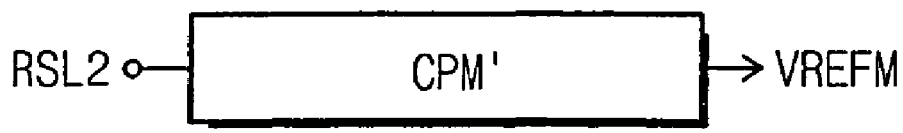

NON-VOLATILE SEMICONDUCTOR MEMORY DEVICE

CROSS REFERENCE TO RELATED APPLICATIONS

This application is a continuation of U.S. patent application Ser. No. 10/922,122, filed Aug. 18, 2004, now U.S. Pat. No. 7,016,232, which claims priority from Korean Patent Application No. 2003-57247, filed on Aug. 19, 2003, the contents of which is herein incorporated by reference in its entirety.

FIELD OF THE INVENTION

This disclosure generally relates to semiconductor memory devices and, more specifically, to flash memory devices performing a sense operation employing reference memory cells.

BACKGROUND OF THE INVENTION

In the field of electronic devices such as computer systems, digital handy terminals, and so on, non-volatile memory devices have been considered to be an important component in recent years. In this electronic device, there is increasingly a demand for memory devices to have a large storage capacity. In order to satisfy this demand it is very important to improve device integration. However, due to many limits, present process technologies have not allowed for a dramatic improvement of integration. To overcome this problem, methods for doubling storage capacity without needing to improve integration have been developed. As is well-known, these methods include a technique for storing multi-bit (multi-level) data in one memory cell.

Typical examples of memories for storing multi-bit data are disclosed in U.S. Pat. No. 6,122,188 entitled "NON-VOLATILE MEMORY DEVICE HAVING MULTI-BIT CELL STRUCTURE AND A METHOD OF PROGRAMMING SAME" and U.S. Pat. No. 5,673,223 entitled "NON-VOLATILE SEMICONDUCTOR MEMORY DEVICE WITH MULTIPLE WORD LINE VOLTAGE GENERATOR".

Sense amplification circuits have been widely used to read/write multi-bit data stored in memory cells. The sense amplification circuits sense and amplify data stored in a selected memory cell by comparing an amount of a current flowing through a selected memory cell with a reference current. To generate the reference current, generally, a reference memory cell is arranged in the sense amplification circuit. For example, when one memory cell stores a single-bit data, one reference memory cell is therein. In addition, when one memory cell stores 2-bit data, three reference memory cells are therein. The reference memory cells located in the sense amplification circuit should be implemented to have different threshold voltages.

If sense amplification circuits are needed in multi-bit memory devices, multiplicity of the reference memory cells may be arranged in each of the sense amplification circuits. In the multi-bit memory devices, each of the memory cells has any one of a multitude of threshold voltage distributions, which correspond to multi-bit states, respectively. Additionally, each of the memory cells has a small margin in comparison with a single-bit memory device. Therefore, in order to read multi-bit data employing a small margin, there is a need to more precisely control threshold voltages of the reference memory cell. Accordingly, it is important to perform a test operation for deciding whether each of the reference memory cell has a required threshold voltage so as to strictly control threshold voltages of the reference memory cells in the sense amplification circuits. Furthermore, as is well-known, the reference memory cell in the sense amplification circuit needs several lay-out regions (e.g., a special region for the reference memory cell or a special well region for high-voltage transistors used to control the reference memory cell).

Embodiments of the invention address these and other limitations in the prior art.

SUMMARY OF THE INVENTION

Embodiments of the present invention provide a flash memory device capable of having reduced lay-out area for the reference memory cells. Embodiments also provide a flash memory device capable of reducing testing-time. Embodiments of the invention also provide a flash memory device capable of improving reading-time.

BRIEF DESCRIPTION OF THE DRAWINGS

FIG. 3A is a circuit diagram of an example current copier circuit shown in FIG. 2.

FIG. 3B is a circuit diagram of another current copier circuit shown in FIG. 2.

DETAILED DESCRIPTION OF THE PREFERRED EMBODIMENT

The present invention will be described more fully hereinafter with reference to the accompanying drawings, in which exemplary embodiments of the invention are shown. Also, embodiments of the present invention will be described employing a memory device storing multi-level data, for example, a NOR-type flash memory device.

Figure 1:
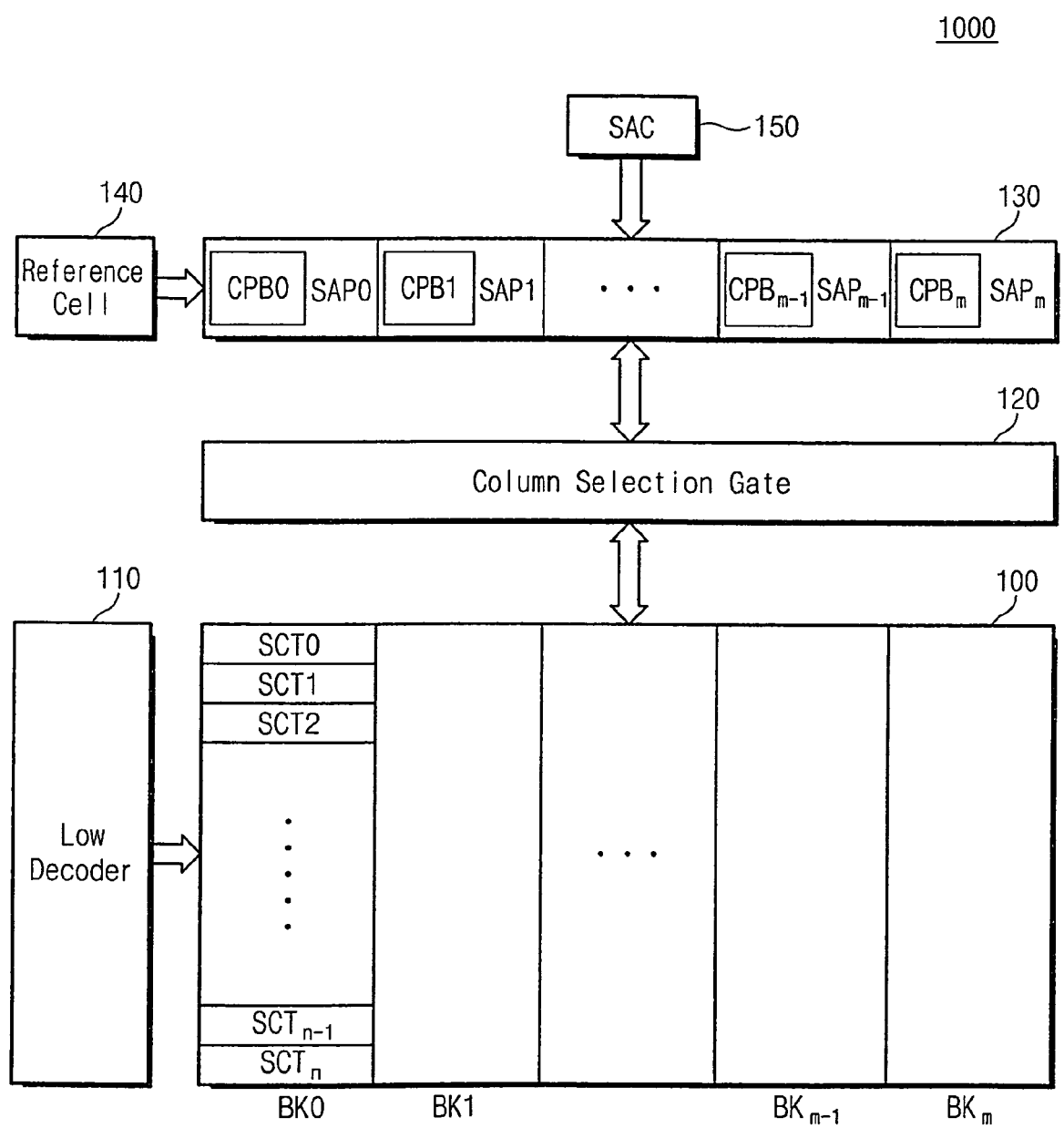
FIG. 1 is a block diagram of a flash memory device according to an embodiment of the present invention.

FIG. 1 is a block diagram of a flash memory device according to embodiments of the present invention. Referring to FIG. 1, the flash memory device 1000 includes a memory cell array 100 for storing data information. The memory cell array 100 is formed with banks BK0–BKm.

Each of the banks BK0–BKm is constructed with sectors SCT0–SCTn. Each sector (not shown) includes memory cells arranged in a matrix format of rows (word lines) and columns (bit lines). Each of the memory cells may be constructed with a floating-gate transistor. In each bank, the word lines of each sector may be selected by a low decoder circuit 110. It will be apparent to one skilled in the art, and hence further description is omitted.

A column selection gate circuit 120 connects bit lines of a selected sector in a selected bank with a sense amplification block 130. The sense amplification block 130 includes sense amplification circuits SAP0–SAPm corresponding to each bank BK0–BKm. The sense amplification circuits SAP0–SAPm are controlled by a sense amplification control circuit 150. Each of the sense amplification circuits SAP0–SAPm reads data from a sector selected by the column selection gate circuit 120. Corresponding current copier circuits CPB0–CPBm are arranged in the sense amplification circuits SAP0–SAPm, respectively. Each of the current copier circuits CPB0–CPBm copies reference currents that are supplied from a reference cell array 140 and supplies them to corresponding amplification circuits SAP0–SAPm.

Figure 2:
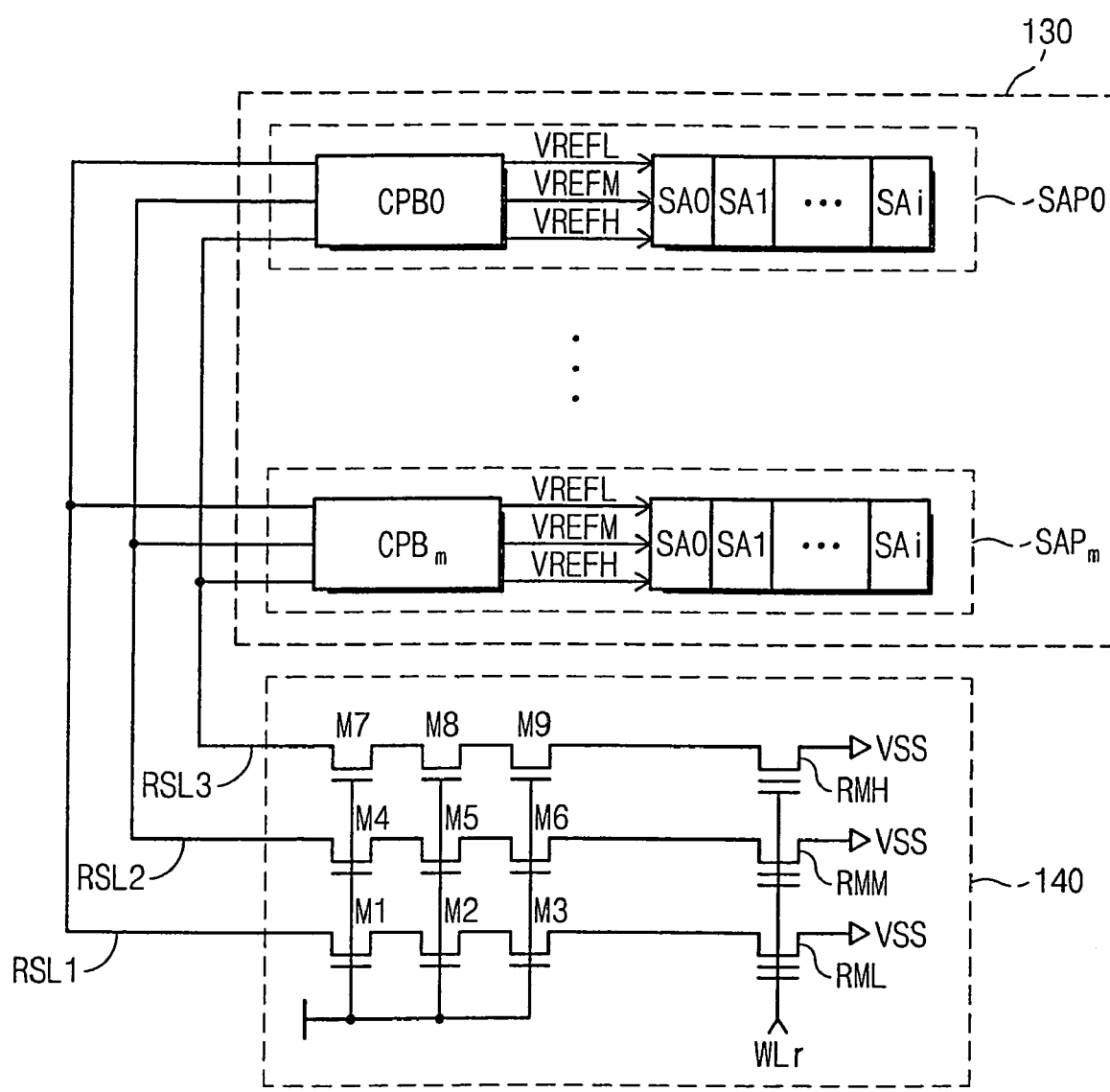
FIG. 2 is a block diagram of an example sense amplification block and reference cell array of FIG. 1.

FIG. 2 is a block diagram showing an example sense amplification block 130 and the reference cell array 140, which are shown in FIG. 1.

The reference cell array 140 includes three reference memory cells RML, RMM and RMH. The reference memory cells RML, RMM and RMH may be implemented to have different threshold voltages. For example, the reference memory cell RML can have a low threshold voltage in comparison with the reference memory cell RMM, and the reference memory cell RMH can have a high threshold voltage in comparison with the reference memory cell RMM. The reason for this is to read 2-bit data stored in each memory cell. To read N-bit data (N is an integer larger than 3), it is apparent that many memory cells are needed.

Referring to FIG. 2, the reference memory cell RML has a control gate connected to a reference word line WLr, a grounded source, and a drain connected through NMOS transistors M1, M2 and M3 to a reference signal line RSL1. The reference memory cell RMM has a control gate connected to a reference word line WLr, a grounded source, and a drain connected through NMOS transistors M4, M5 and M6 to a reference signal line RSL2. The reference memory cell RMH has a control gate connected to a reference word line WLr, a grounded source, and a drain connected through NMOS transistors M7, M8 and M9 to a reference signal line RSL3. When the reference word lines WLr are activated, different reference currents flow through the reference memory cells depending on the setup threshold voltages.

In this case, NMOS transistors (M1–M3), (M4–M6), and M7–M9) corresponding to each of the reference memory cells RML, RMM, and RMH correspond to column pass gates of the column selection gate circuit 120 which are passed when a bit line is connected to a sense amplification block 130.

As shown in FIG. 2, the sense amplification block 130 is constructed with the sense amplification circuits SAP0–SAPm corresponding to each bank. Each of the sense amplification circuits includes sense amplifiers and a current copier circuit. For example, the sense amplification circuit SAP0 includes the sense amplifiers SA0–SAi and the current copier circuit CPB0. The number of sense amplifiers may be determined according to the input/output architecture. For example, if the flash memory has an input/output architecture of X16, the sense amplification circuit may be constructed with 16 sense amplifiers. Reference signal lines RSL1, RSL2 and RSL3 are commonly connected to the current copier circuits CPB0–CPBm of the sense amplification circuits SAP0–SAPm. Each of the current copier circuits CPB0–CPBm generate reference voltages VREFL, VREFM and VREFH by copying reference currents flowing through the reference signal lines RSL1, RSL2 and RSL3 (that is, currents flowing through reference memory cells). In each current copier circuit, the reference voltages VREFL, VREFM and VREFH are commonly provided to the sense amplifiers SA0–SAi of a corresponding sense amplification circuit.

FIG. 3A is a circuit diagram of an example current copier circuit shown in FIG. 2 according to embodiments of the present invention.

Referring to FIG. 3A, the current copier circuit CPB0 includes three current copiers CPL, CPM and CPH. The current copier CPL is connected to the reference signal line RSL1, the current copier CPM is connected to the reference signal line RSL2, and the current copier CPH is connected to the reference signal line RSL3. The reference signal lines RSL1, RSL2 and RSL3, as previously mentioned, are connected to the reference memory cells RML, RMM and RMH of the reference cell array 140, respectively. The current copier CPL includes PMOS transistors M11 and M12, the NMOS transistor M13 and an amplifier AMP1. The PMOS transistor M11, with a source connected to a power voltage VCC, has a drain commonly connected to the reference signal line RSL1, and a gate. Furthermore, a gate and a drain of the PMOS transistor M11 are connected to the inverting input terminal (−) of the amplifier AMP1. The PMOS transistor M12 has a source, a gate, and a drain. The source is connected to the power voltage VCC, and the gate is commonly connected to the non-inverting terminal (+) of AMP1. The NMOS transistor M13 has a gate connected to an output signal VREFL of the amplifier AMP1, and is connected between a drain of the PMOS transistor M12 and a ground reference voltage VSS.

The rest of current copiers CPM and CPH are constructed in the same way as the current copier that is explained above, and description thereof is thus omitted. However, output voltages VREFM and VREFH of the current copiers CPM and CPH may be determined according to reference currents flowing through the reference signal lines RSL2 and RSL3, respectively.

When the reference word line WLr (FIG. 2) becomes activated, the reference memory cells RML, RMM and RMH are turned on. Under this condition, a current is provided through the PMOS transistor M11, which is operated as a diode, to the reference signal line RSL1. The current provided to the reference signal line RSL1 is discharged through the reference memory cell RML. Current through the reference memory cell RML depends on the threshold voltage of the reference memory cell RML. At this time, a drain and a gate voltage of the PMOS transistor M11 will be at a preset value according to the threshold voltage of the reference memory cell RML. The amplifier AMP1 compares input voltages (drain voltages of the PMOS transistors M11 and M12) and generates the reference voltage VREFL. The reference voltage VREFL is applied to a gate of the NMOS transistor M13. These processes continue until the input voltages (the drain voltages of the PMOS transistors M11 and M12) are equal. When the input voltages of the amplifier AMP1 are equal, current through the NMOS transistor M13 becomes the same as that through the reference memory cell RML. In other words, the current copier CPL copies a current flowing through the reference memory cell RML, and a copied current iL flows through the NMOS transistor M13.

The rest of current copiers CPM and CPH generate corresponding reference voltages VREFM and VREFH, respectively, in the same way as explained above.

Note that even if transconductance of the reference memory cell RML is not consistent with that of the NMOS transistor M13, the current copier according to embodiments of the present invention is capable of copying a current flowing through the reference memory cell RML exactly. This is accomplished by comparing drain voltages of the PMOS transistors M11 and M12 and adjusting a gate voltage of the NMOS transistor M13 according to a comparison result until the drain voltages of the transistors M11 and M12 become equal to each other. As a result, if drain voltages of the PMOS transistors M11 and M12 are equal to each other, the same currents iR and iL flow through the PMOS transistors M11 and M12, and these currents iR and iL flow through the reference memory cell RML and the NMOS transistor M13, respectively.

FIG. 3B is a circuit diagram of an example current copier circuit shown in FIG. 2 according to another embodiment of the present invention.

Referring to FIG. 3B, the current copier circuit CPB0' includes three current copiers CPL', CPM' and CPH'. The current copier CPL' includes PMOS transistors M14 and M15, a NMOS transistor M16 and an amplifier AMP2. The current copier CPL' shown in FIG. 3B is identical to the current copier shown in FIG. 3A except that a gate of the PMOS transistor M15 is connected to a gate of the PMOS transistor M14 rather than a non-inversion terminal (+) of the amplifier AMP2. The rest of the current copiers CPM' and CPH' are constructed in the same way as the current copier CPL' explained above, and description thereof is thus omitted.

In FIG. 3B, the PMOS transistor M15 is used as a small signal amplifier. The reason for this is to amplify a voltage difference of drains in the PMOS transistors M14 and M15. The amplified voltage difference of the drains is amplified through the amplifier AMP2 again so that an amplification ratio is improved as a whole. Accordingly, an offset can be removed.

Figure 4:
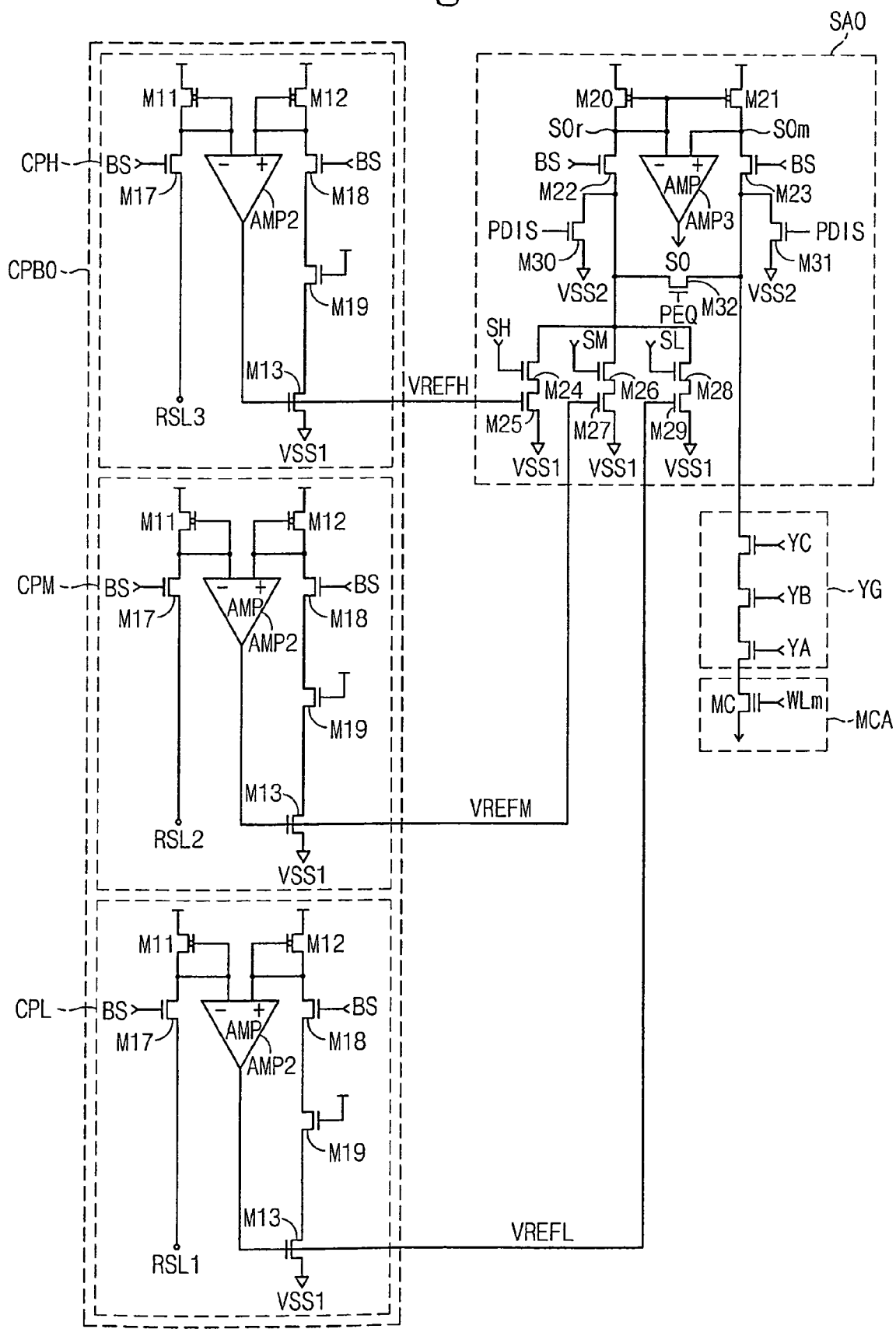
FIG. 4 is a circuit diagram of an example sense amplifier shown in FIG. 2.

FIG. 4 includes a circuit diagram of an example sense amplifier SA0 shown in FIG. 2 according to embodiments of the invention.

Referring to FIG. 4, the sense amplifier SA0 includes PMOS transistors M20 and M21, NMOS transistors M22–M32 and an amplifier AMP3. The PMOS transistor M20 has a source connected to the power voltage VCC, a gate commonly connected to a S0r node (or a reference sense node), and a drain. The S0r node is connected to the inverting input terminal (−) of the amplifier AMP3. The PMOS transistor M21 has a source connected to the power voltage, a gate connected to a gate of the PMOS transistor M20, and a drain connected to a S0m node (or a main sense node). The S0m node is connected to a non-inverting input terminal of the amplifier AMP3. The NMOS transistor M22, with a drain connected to the S0r node, is controlled by a bias voltage BS. The NMOS transistor M23, with a drain connected to the S0m node, is controlled by the bias voltage BS. A source of the NMOS transistor M23 is connected through a column selection gate YG to a memory cell MC.

The NMOS transistors M24 and M25 are connected in series between the source of the NMOS transistor M22 and the ground reference voltage. The NMOS transistor M24 is controlled by a selection signal SH, and the NMOS transistor M25 is controlled by the reference voltage VREFH from the current copier CPH. The NMOS transistors M26 and M27 are connected in series between the source of the NMOS transistor M22 and the ground reference voltage. The NMOS transistor M26 is controlled by a selection signal SM, and the NMOS transistor M27 is controlled by the reference voltage VREFM from the current copier CPM. The NMOS transistors M28 and M29 are connected in series between the source of the NMOS transistor M22 and the ground reference voltage. The NMOS transistor M28 is controlled by a selection signal SL, and the NMOS transistor M29 is controlled by the reference voltage VREFL from the current copier CPL. The NMOS transistors M30 and M31 are operated in response to a control signal PDIS and discharge voltages of the S0r node, S0m node, and a bit line, (not shown) respectively. The PMOS transistor M32 equalizes voltages of the S0r node and the S0m node in response to a control signal PEQ.

In FIG. 4, the PMOS transistor M21 is used as a small signal amplifier. The reason for this is to amplify the voltage difference of drains in the PMOS transistors M20 and M21. The amplified voltage difference of the drains is amplified through the amplifier AMP3 again so that an amplification ratio is improved as a whole. Accordingly, an offset can be removed.

The gate voltage VREFH of the NMOS transistor M25 is controlled by the current copier CPH so as to copy a current flowing through the reference memory cell RMH. The gate voltage VREFM of the NMOS transistor M27 is controlled by the current copier CPM so as to copy a current flowing through the reference memory cell RMM. The gate voltage VREFL of the NMOS transistor M29 is controlled by the current copier CPL so as to copy a current flowing through the reference memory cell RML.

The sense amplifier SA0 and the current copiers CPL, CPM and CPL are adjoined to each other, and the same power voltage is provided to the sense amplifier SA0 and the current copiers CPL, CPM and CPL. As a result, it is possible to prevent a current copy distortion due to noise. In other words, if noise exists on the supply voltage of the sense amplifier SA0, source voltages of the PMOS transistors M20 and M21 of the sense amplifier SA0 would be affected. As a result, drain voltages of the NMOS transistors M25, M27 and M29 would be also affected. Accordingly, copied reference currents would be changed. However, each of the current copiers CPL, CPM and CPH recognizes a variation of the supply voltage through the PMOS transistors M11 and M12 and controls gate voltages VREFL, VREFM and VREFH suitable to the variation. According to control gate voltages VREFL, VREFM and VREFH, currents, which flow through corresponding NMOS transistors M25, M27 and M29 of the sense amplifier SA0, are maintained irrespective of the variation of the supply voltage.

Figure 5:
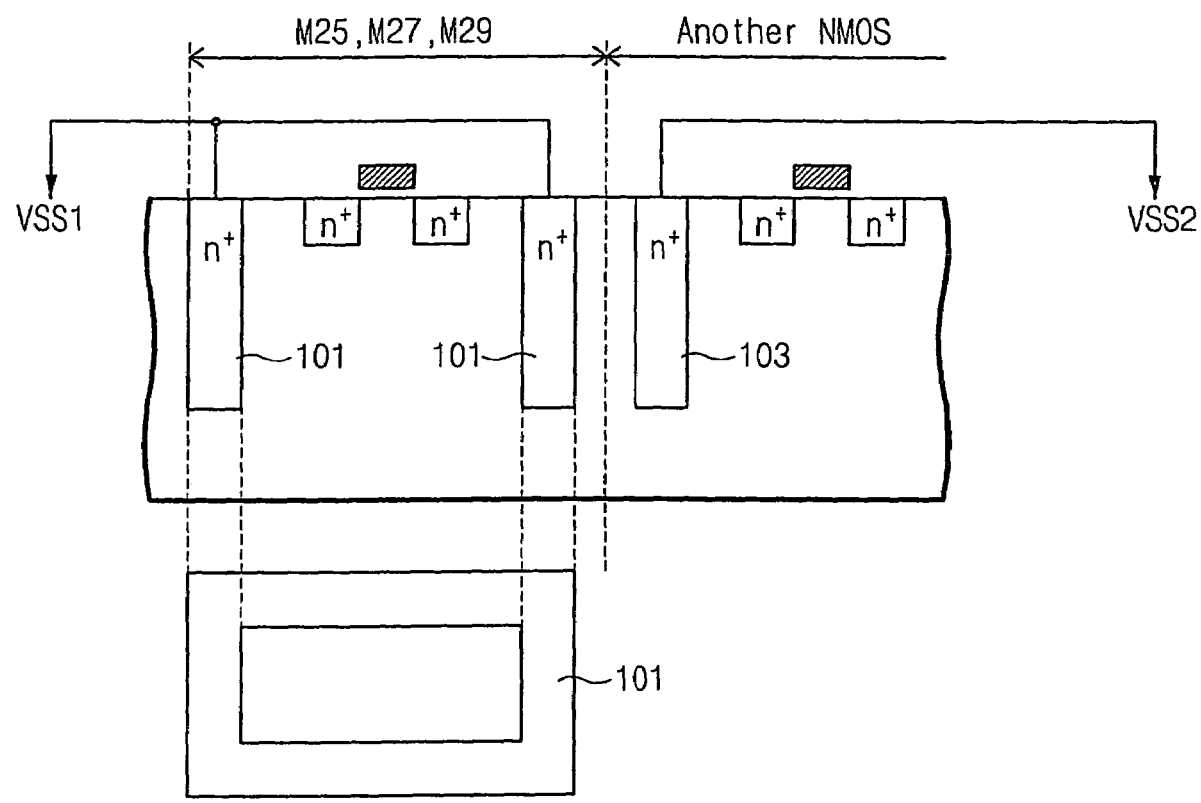
FIG. 5 is a cross-sectional view showing a lay-out structure of transistors shown in FIG. 4.

In this embodiment, as shown in FIG. 4, a ground reference voltage line VSS1 that is used in the NMOS transistors of the sense amplifier SA0 is separated from other NMOS transistors and other ground reference voltage line VSS2. Specifically, as shown in FIG. 5, the NMOS transistors M25, M27 and M29 are formed in a substrate separated by a guard band 101. In the same manner, another NMOS transistor of the sense amplifier SA0 is also formed in a substrate separated by another guard band 103. According to this structure, the NMOS transistors M25, M27 and M29 are free from ground noise, generated when the NMOS transistors M30 and M31 turn on, depending on the activation of the control signal PDIS, or when the amplifier AMP3 is operated.

In addition, if source voltages of the NMOS transistors M25, M27 and M29 are varied by noise, source voltages of the NMOS transistors M13 of the current copiers CPH, CPM and CPL are varied simultaneously. Therefore, the reference voltages VREFL, VREFM and VREFH are varied depending on a variation of source voltage in accordance with feedback characteristic of corresponding current copiers. This variation enables the current flowing through the NMOS transistors M25, M27 and M29 to maintain a similarity to the current flowing through the reference memory cells. For example, the gate voltage may fluctuate with noise generated in the source of the NMOS transistor M25. As a specific example of noise effect, assume the current flowing through the NMOS transistor M25 decreases. At the same time, the current flowing though the NMOS transistor M13 also decreases. If the current flowing through the NMOS transistor M13 decreases, the drain voltage of the PMOS transistor M12 increases. This voltage change causes the gate voltage VREFH of the NMOS transistor M13 to be increased. The increased gate voltage causes currents of the NMOS transistors M13 and M25 to increase. Accordingly, even if source/gate voltage increases due to noise, the current flowing through the NMOS transistors M25, M27 and M29 maintains a steady current at the level of the current of the reference memory cells.

In embodiments of the invention, the bias voltage BS may be controlled to be supplied only if a corresponding bank is selected.

Figure 6:
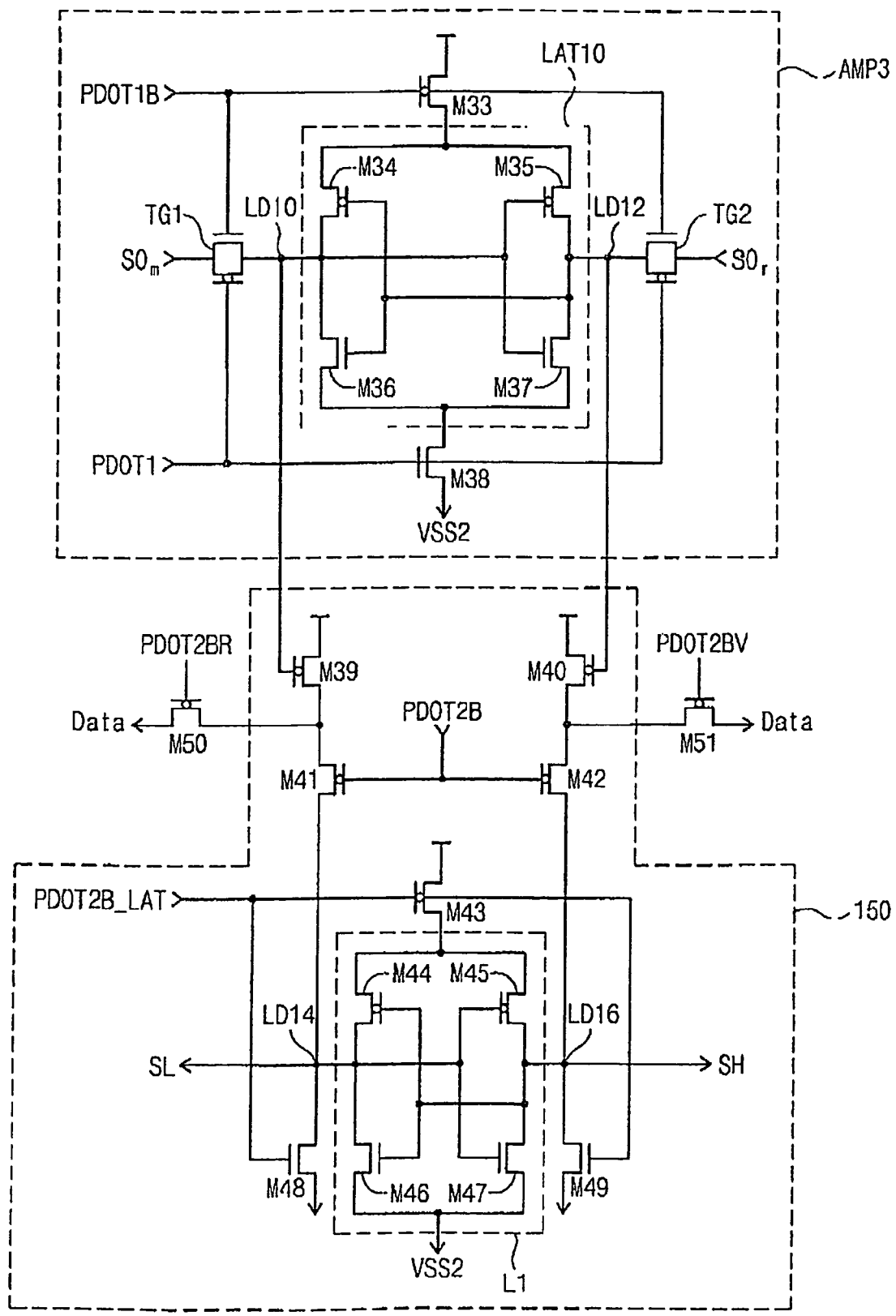
FIG. 6 is a circuit diagram of an example amplifier shown in FIG. 4 and an example sense amplification control circuit shown in FIG. 1.

FIG. 6 is an example circuit diagram of the amplifier AMP3 shown in FIG. 4 and the sense amplification circuit 150 shown in FIG. 1 according to embodiments of the invention.

Referring to FIG. 6, the amplifier AMP3 includes PMOS transistors M33, M34 and M35, NMOS transistors M36, M37 and M38 and transmission gates TG1 and TG2. The S0m node of the amplifier AMP3 is connected through the transmission gate TG1 to a latch node LD10, and the S0r node of the amplifier AMP3 is connected through the transmission gate TG2 to a latch node LD12. The transmission gates TG1 and TG2 are operated in response to control signals PD0T1B and PD0T1. The PMOS transistor M33 has its source connected to the power voltage and its gate is connected to the control signal PD0T1B. The PMOS and NMOS transistors M34 and M36, respectively, are connected in series between the drain of the PMOS transistor M33 and the drain of the NMOS transistor M38, and also commonly controlled by the voltage of the latch node LD12. The PMOS and NMOS transistors M35 and M37 are connected in series between the drain of the PMOS transistor M33 and the drain of the NMOS transistor M38 and also commonly controlled by the voltage of the latch node LD10.

In this embodiment of the present invention, the latch LAT10 is structured by the PMOS transistors M34 and M35, and the NMOS transistors M36 and M37.

While the control signals PD0T1B and PD0T1 maintain an inactive state, the latch nodes LD10 and LD12 are electrically connected through corresponding transmission gates TG1 and TG2 to the S0m and the S0r nodes, respectively. When the control signals PD0T1B and PD0T1 become activated, the latch nodes LD10 and LD12 are electrically isolated from the S0m and the S0r nodes. At the same time, the PMOS and NMOS transistors M33 and M38 are turned on. These operations amplify a voltage difference of the latch nodes LD10 and LD12 by the latch LAT10.

Referring to FIG. 6, the sense amplification control circuit 150 includes the PMOS transistors M39, M40, M41, M42, M44 and M45 and the NMOS transistors M46, M47, M48 and M49. The PMOS transistor M39 has a source connected to the power voltage and a gate connected to the latch node LD10 of the amplifier AMP3. The PMOS transistor M40 has a source connected to the power voltage and a gate connected to the latch node LD12 of the amplifier AMP3. The PMOS transistor M41 has a source connected to the drain of the PMOS transistor M39, a drain connected to a latch node LD14 and a gate connected to receive the control signal PD0T2B. The PMOS transistor M42 has a source connected to the drain of the PMOS transistor M40, a drain connected to a latch node LD16, and a gate connected to receive the control signal PD0T2B. The NMOS transistor M48 has a drain connected to the latch node LD14, a source connected to the ground reference voltage and a gate connected to receive the control signal PD0T2B_LAT. The NMOS transistor M49 has a drain connected to the latch node LD16, a source connected to the ground reference voltage and a gate connected to receive the control signal PD0T2B_LAT. The PMOS transistor M43 has a source connected to the power voltage and a gate connected to receive the control signal PD0T2B_LAT. The PMOS and NMOS transistors M44 and M46 are connected in series between the drain of the PMOS transistor M43 and the ground reference voltage, and also commonly controlled by the voltage of the latch node ND16. The PMOS and NMOS transistors M45 and M47 are connected in series between the drain of the PMOS transistor M43 and the ground reference voltage and also commonly controlled by the voltage of the latch node ND14.

In FIG. 6, the connection node of the PMOS transistors M39 and M41 is connected to the PMOS transistor M50, and the connection node of the PMOS transistors M40 and M42 is connected to the PMOS transistor M51. The PMOS transistor M50 is controlled by the control signal PD0T2BR for triggering a read operation, and outputs data sensed and amplified by the sense amplifier during the read operation. The PMOS transistor M51 is controlled by the control signal PD0T2BV for triggering a verification operation, and outputs data sensed and amplified by the sense amplifier during the verification operation.

Figure 7:
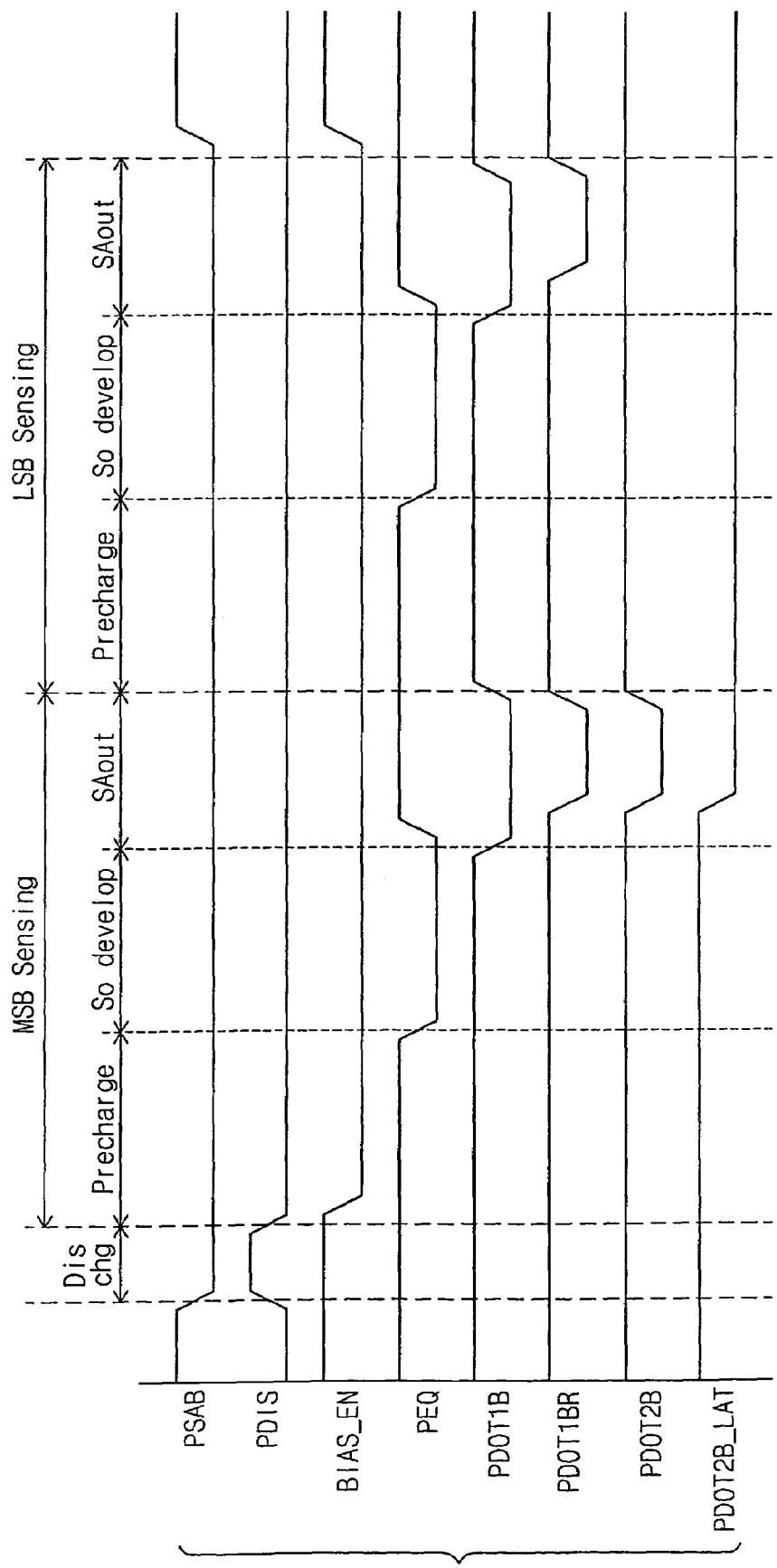
FIG. 7 is a timing diagram illustrating a read-operation of a flash memory device in accordance with embodiments of the invention.

FIG. 7 is a timing diagram illustrating a read operation of the flash memory device of FIG. 1. For example, the read operation of the described flash memory device for storing a multi-bit (e.g., 2-bit) data will be explained in detail with reference to drawings herein. As well-known in the field of memory technologies, 2-bit data stored in a selected memory cell is read by two sense operations. Each of the sense operations, as shown in FIG. 7, includes a pre-charge period, a generation period, and a data output period. Before performing the sense operation a discharge operation is carried out by the activation of the control signal PDIS (FIG. 4). For a convenience of explanation, the read operation will be carried out on the basis of one sense amplifier SA0.

As shown in FIG. 7, as a bias enable signal BIAS_EN is activated, the bias voltage BS is provided to the sense amplifier SA0 and the current copiers CPL, CPM and CPH. During the pre-charge period, the control signals PD0T1B, PD0T2B and PD0T2B_LAT maintain a high level. Accordingly, the S0m and S0r nodes are electrically connected to the latch nodes LD10 and LD12, and the latch nodes LD14 and LD16 in the sense amplification control circuit 150 are pre-charged through the NMOS transistors M48 and M49 to the ground reference voltage.

As the reference word lines WLr becomes activated, and the bias voltage BS is applied to the current copiers CPL, CPM and CPH, the PMOS transistor M11 of the current copiers supplies a current to the reference signal lines RSL1, RSL2 and RSL3, and currents supplied to the reference signal lines RSL1, RSL2 and RSL3 are discharged through corresponding reference memory cells RML, RMM and RMH, respectively. As previously mentioned, the reference memory cells RML, RMM and RMH have different threshold voltages that are set up in advance. Therefore, different reference currents flow through the reference signal lines RSL1, RSL2 and RSL3. The reference signal lines RSL1, RSL2 and RSL3 are commonly connected to the current copier circuits CPB0–CPBm, which correspond to the banks BK0–BKm, respectively. In the current copiers CPL, CPM and CPH, each of the amplifiers AMP2 senses and amplifies the voltage difference of the drain voltages of the PMOS transistors M11 and M12. As a result, the gate voltages VREFL, VREFM and VREFH are determined. If there is no voltage difference of the drain voltages, a current conducts through each of the NMOS transistors M13 of the current copiers CPL, CPM and CPH. In this case, the amount of the current is the same as that of the current flowing through a corresponding reference memory cell. In accordance with this process, gate voltages VREFH, VREFM and VREFL of the NMOS transistors M25, M27 and M29 at the sense amplifier SA0 will be determined.

To determine an upper data, the control signal SM becomes activated. As a result, the current supplied to the SOr node flows through the NMOS transistors M26 and M27. The memory cell selected by the column selection gate circuit is connected to the SOm node, thereby creating a voltage difference between the latch nodes LD10 and LD12, which are connected to the SOr and SOm nodes, respectively. With activating the control signal PD0T1B, the voltage difference between the latch nodes LD10 and LD12 becomes amplified by the latch LAT10. For example, when the amount of the current flowing through the NMOS transistors M26 and M27 is larger than that of the current flowing through a selected memory cell MC, the voltage of the latch node LD10 is relatively higher than that of the latch node LD12. The transmission gates TG1 and TG2 become non-conducting according to the activation of the control signal PD0T1B, the PMOS and NMOS transistors M33 and M38 are turned on. The voltages of the latch nodes LD10 and LD12 become amplified to a power voltage and a ground reference voltage, respectively.

Next, as shown in FIG. 7, the control signals PD0T2B and PD0T2B_LAT become activated at a low level. The PMOS transistors M41, M42 and M43 are turned on, and the NMOS transistors M48 and M49 are turned off. Under this condition, the sense amplification control circuit 150 generates the selection signals SL and SH for selecting a reference current necessary for the next sense operation according to the voltages of the latch nodes LD10 and LD12. When the latch nodes LD10 and LD12 have high and low levels, respectively, the PMOS transistor M39 is turned off, and the PMOS transistor M40 is turned on. Accordingly, while the latch node LD14 maintains a ground reference voltage, the latch node LD16 becomes a power voltage by the PMOS transistors M40 and M42. That is, the selection signals SL and SH become low and high levels, respectively. On the contrary, if the latch nodes LD10 and LD12 have low and high levels then the selection signals SL and SH become high and low levels, respectively. While the control signal PD0T2B maintains a low level, the PMOS transistor M50 outputs data transferred by the PMOS transistor M39 to a register (not shown) located at the next terminal.

According to the process described above, the upper data bit out of 2-bit data stored at a selected memory cell is sensed. The reference current of the sense operation carried out next is selected according to an activated signal out of the selection signals SL and SH, which are generated by the sense amplification control circuit 150. For instance, when the selection signal SL becomes activated, the NMOS transistor M28 (FIG. 4) is activated, and a reference current, which flows through the reference memory cell RML, having the lowest threshold voltage, will be selected. When the selection signal SH becomes activated, the NMOS transistor M24 is activated, and a reference current, which flows through the reference memory cell RMH having the highest threshold voltage, will be selected. A lower data bit will be sensed employing a determined reference current in the same way as explained above.

The SOm node of each sense amplifier is connected through the column selection gate circuit and a global bit line to a selected memory cell. Whereas, the SOr node of each sense amplifier is only connected to an NMOS transistor. In this case, the reference current only flows through the NMOS transistor. A loading difference between the SOm node and the SOr node leads to a reduced sense speed. To secure fast read time, it is necessary for the SOm and SOr nodes to have the same or very similar loading. To accomplish this, the flash memory device according to embodiments of the invention is formed by connecting another global bit line adjoined to the selected global bit line and the SOr node. The flash memory will be more fully described hereinafter.

Figure 8:
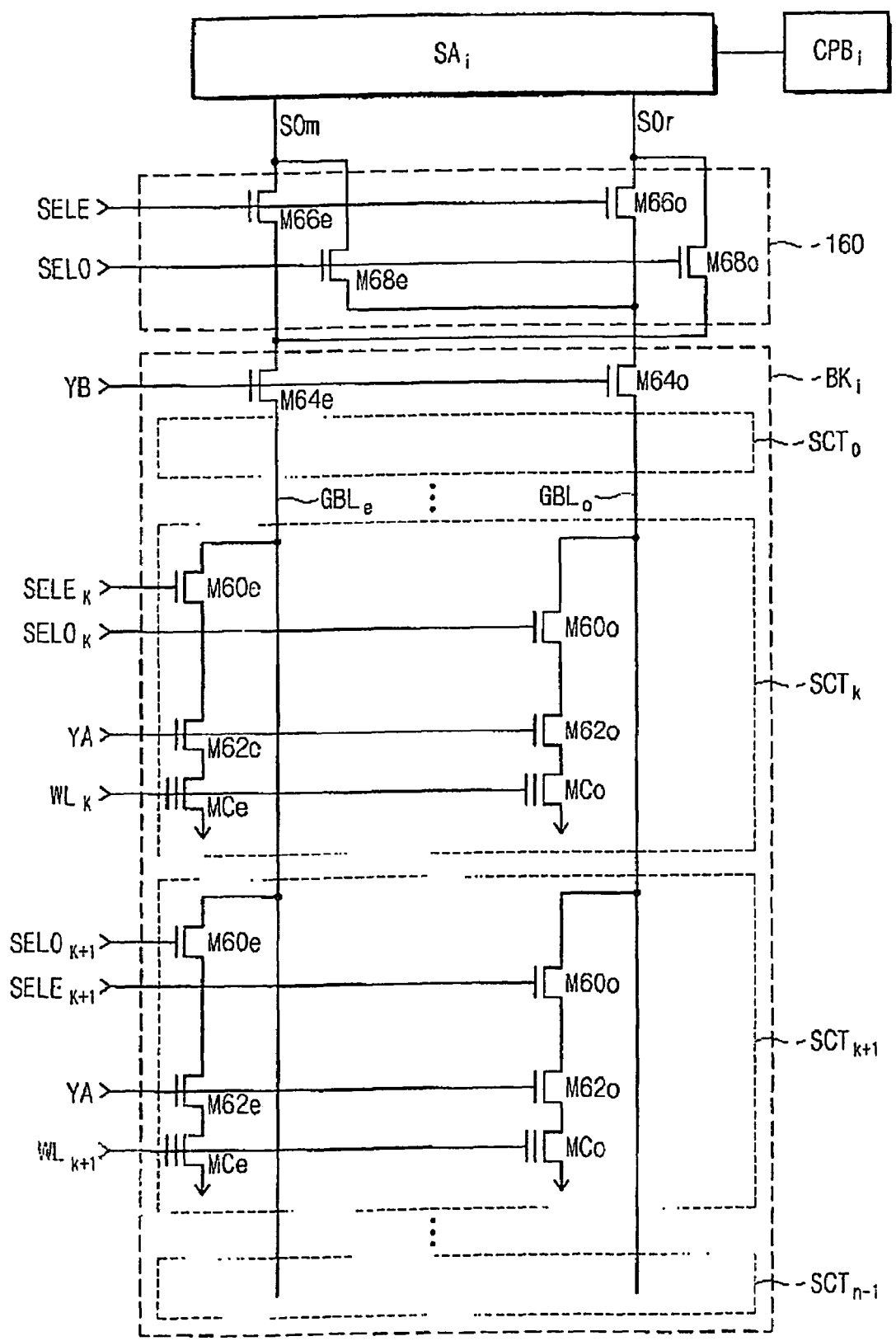
FIG. 8 is a circuit diagram illustrating the flash memory device in accordance with another embodiment of the present invention.

FIG. 8 shows a construction related with only two global bit lines GBLe and GBLo. Referring to FIG. 8, a bank BKi includes sectors SCT0–SCTn−1. The global bit lines GBLe and GBLo are arranged to be shared with the sectors SCT0–SCTn−1 in the bank BKi. The elements of each sector are denoted by the same reference numerals. In the sector SCTk, a memory cell MCe is connected through corresponding selection transistors M60e and M62e to the global bit line GBLe, and a memory cell MCo is connected through corresponding selection transistors M60o and M62o to the global bit line GBLo. The memory cells MCe and MCo are connected to the same word line WLk. The selection transistor M60e is controlled by a selection signal SELEk, and the selection transistor M60o is controlled by a selection signal SELOk. The selection transistors M62e and M62o are commonly controlled by a selection signal YA. A switch circuit 160 is operated in response to the selection signals SELE and SELO and includes NMOS transistors M66e, M68e, M66o and M68o. The switch circuit 160 connects a selected global bit line out of the global bit lines GBLe and GBLo to the SOm node of the sense amplifier SAi. At the same time, the switch circuit 160 connects a non-selected global bit line to the node SOr of the sense amplifier SAi.

On assuming that the memory cell MCe of the sector SCTk is selected, selection signals SELE, SELEk and SELEk+1 are activated, but selection signals SELO, SELOk and SELOk+1 are not activated. The selected memory cell MCe is connected through the NMOS transistors M60e and M62e to the global bit line GBLe, and the global bit line GBLe is connected through the NMOS transistors M64e and M66e to the node SOm of the sense amplifier SAi. At the same time, neighboring non-selected global bit line GBLo is connected through the transistors M60o and M62o of the sector SCTk+1 to the memory cell MCo. The word line WLk+1 of the sector SCTk+1 is not selected. At the same time, the global bit line GBLo is connected through the NMOS transistors M64o and M66o to the node SOr of the sense amplifier SAi. Accordingly, the SOr and SOm nodes of the sense amplifier SAi have the same loading.

On assuming that the memory cell MCo of the sector SCTk is selected, selection signals SEL0, SEL0k and SELOk+1 are activated, but selection signals SELE, SELEk and SELEk+1 are not activated. The selected memory cell MCo is connected through the NMOS transistors M60o and M62o to the global bit line GBLo, and the global bit line GBLo is connected through the NMOS transistors M64o and M66e to the node SOm of the sense amplifier SAi. In this case, the word line WLk+1 of the sector SCTk+1 is not selected. At the same time, neighboring non-selected global bit line GBLe is connected through the transistors M60e and M62e of the sector SCTk+1 to the memory cell MCe. At the same time, the global bit line GBLe is connected through the NMOS transistors M64e and M68o to the node SOr of the sense amplifier SAi. Accordingly, the SOr and SOm nodes of the sense amplifier SAi have the same loading.

If memory cells of the neighboring sector SCTk+1 are selected then global bit lines will be connected to the SOr and SOm nodes of the sense amplifier SAi, as before. Henceforth, further description is omitted.

While embodiments of the invention have been described employing multi-bit data (e.g., a flash memory device for storing 2-bit data), it is to be understood that this invention is not limited to this example. For instance, embodiments of the present invention are operable with a flash memory device for storing single bit data.

Figure 9:
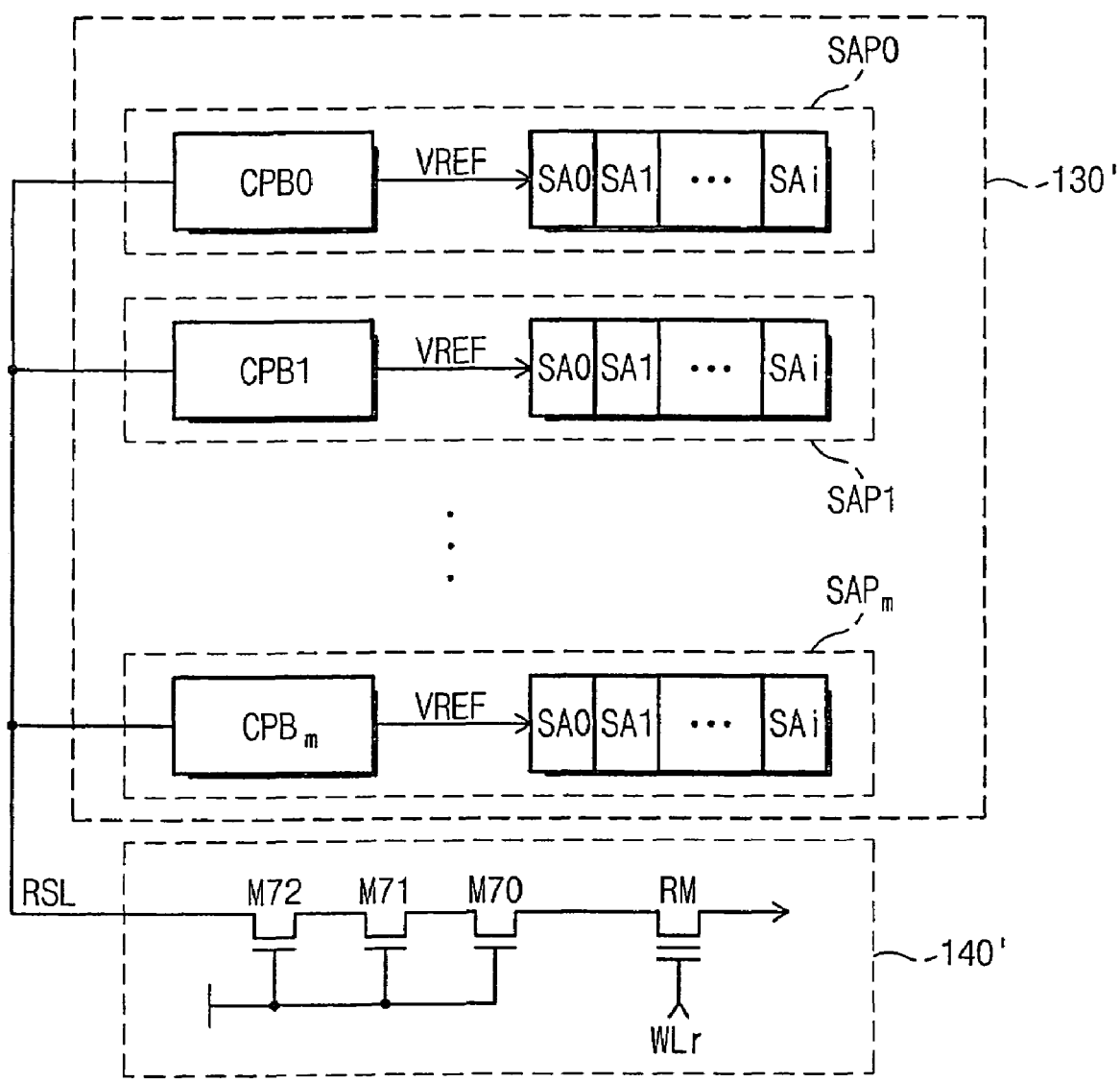
FIG. 9 is a block diagram of an example sense amplification blocks and an example reference cell array, which are shown in FIG. 1 in accordance with other embodiments of the present invention.

FIG. 9 is a block diagram of an example sense amplification block 130 and the reference cell array 140, which are shown in FIG. 1. Referring to FIG. 9, a reference cell array 140' includes a reference memory cell RM. The reference memory cell RM is implemented to have a current suitable to decide an off-cell and an on-cell. The reference memory cell RM includes a grounded source, a control gate connected to a reference word line WLr, and a drain connected through NMOS transistors M70, M71, and M72 to a reference signal line RSL.

As shown in FIG. 9, a sense amplification block 130' includes sense amplification circuits SAP0–SAPm corresponding to each bank. Each of the sense amplification circuits include sense amplifiers and a current copier circuit. For example, the sense amplification circuit SAP0 includes sense amplifiers SA0–SAi and a current copier circuit CPB0. The number of sense amplifiers can be determined according to the input/output architecture. If the flash memory has an input/output architecture of X16, the sense amplification circuit may be constructed with 16 sense amplifiers, for example. The reference signal lines are commonly connected to the current copier circuits CPB0–CPBm of the sense amplification circuits SAP0–SAPm. Each of the current copier circuits CPB0–CPBm generate the reference voltage VREF by copying reference currents flowing through the reference signal line RSL (that is, currents flowing through reference memory cells). In each current copier circuit, the reference voltage VREF is commonly provided to the sense amplifiers SA0–SAi of a corresponding sense amplification circuit.

Figure 10:
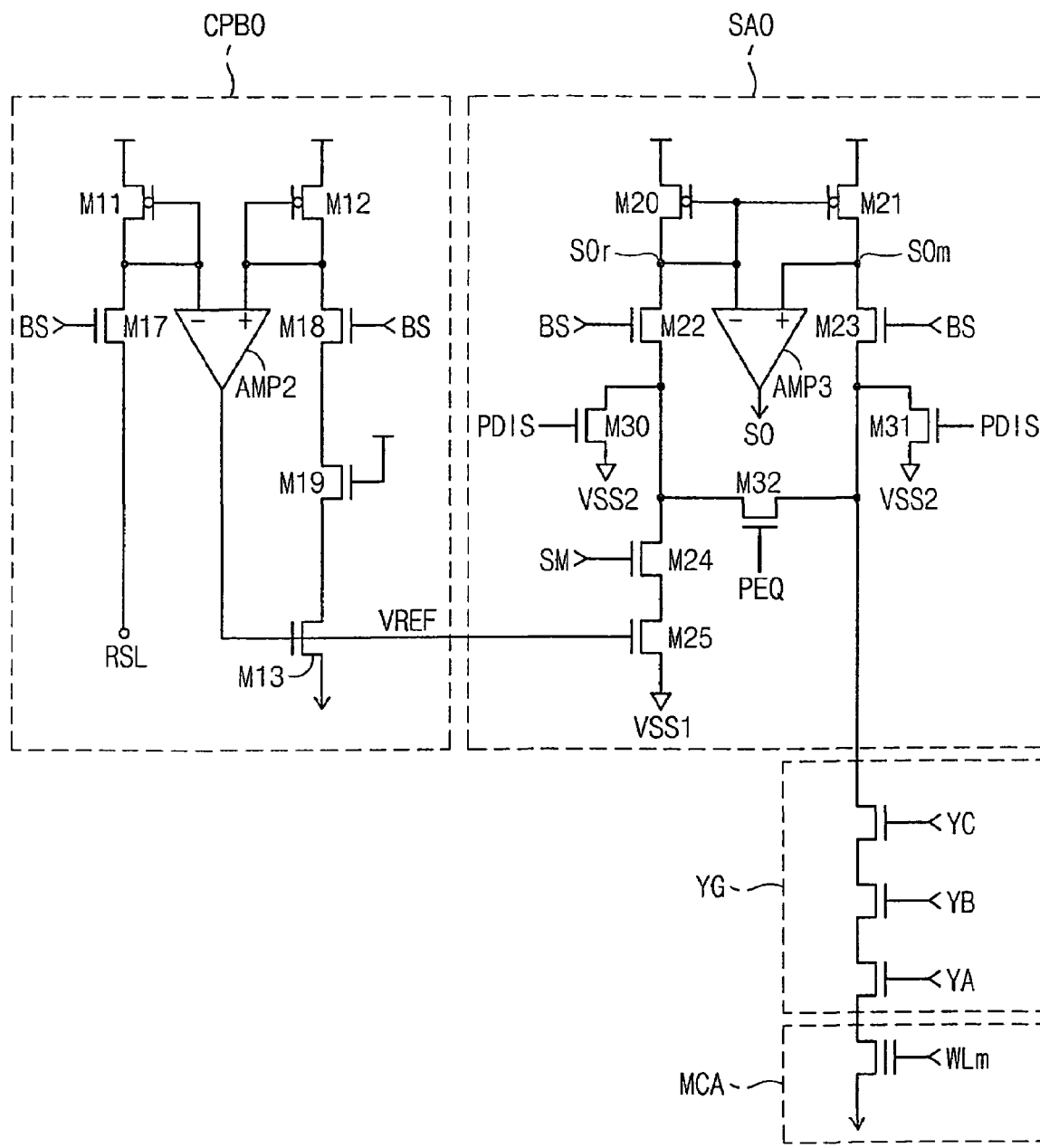
FIG. 10 is a circuit diagram illustrating an example sense amplifier and current copier circuit, which are shown in FIG. 2 in accordance with other embodiments of the present invention.

FIG. 10 shows an example sense amplifier and an example current copier circuit, which are shown in FIG. 2 in accordance with another embodiment of the present invention. Referring to FIG. 10, except that only one current copier circuit is used to sense and amplify the single bit data, the sense amplifier SA0 and the current copier circuit CPB0 of FIG. 10 are substantially constructed in the same way as that shown of FIG. 4, and description thereof is thus omitted. The voltage VREF, which is applied to gates of the NMOS transistors M13 and M25, will be implemented to have an adequate voltage to decide an off-cell and an on-cell. The amplifier AMP3 of the sense amplifier SA0 can be substantially constructed in the same way as that shown in FIG. 6.

The flash memory device according to embodiments the present invention includes sense amplification circuits and current copier circuits, which correspond to the banks. The sense amplification circuit corresponding to each bank includes sense amplifiers. Each sense amplifier is structured to have the reference current based on the NMOS transistor rather than the reference memory cell. The NMOS transistors of the sense amplifiers are commonly controlled by a corresponding current copier circuit. The current copier circuits corresponding to each bank generate reference voltage(s) by copying current(s) flowing through the reference memory cell(s) of the reference cell array. The reference voltage(s) control(s) the NMOS transistors of the sense amplifiers. According to this structure, it is possible to reduce time necessary to control the threshold voltage of the reference memory cell by copying the current flowing through the reference memory cell(s) instead of arranging the reference memory cell(s) in the sense amplification circuit.

Additionally, in accordance with the present embodiment, even though the reference current is copied employing the NMOS transistor having different transconductance in comparison with the reference memory cell, it is possible to exactly copy a current flowing in the reference memory cell. A ground reference voltage line of the NMOS transistor(s) where the reference current flows is separated from another device of the sense amplifier and is formed in different guard bands in the sense amplifier. As a result, there is the advantage of preventing the reference current from being affected by ground power noise.

Furthermore, the global bit lines become switched in order that the SOr and SOm nodes of the sense amplifier have the same loading, so that a read speed (or a sense speed) can be improved.

The invention is broad in scope and can be practiced in many ways. Although particular example embodiments are set out below, embodiments of the invention can take many different forms, and are not limited to those described below.

According to one embodiment of the present invention, a flash memory device includes: a reference cell array; a plurality of banks including memory cells, respectively; a plurality of current copier circuits each corresponding to the banks and generating a reference voltage by copying a reference current that flows through the reference cell array; and a plurality of sense amplifiers each corresponding to the banks and sensing data from the corresponding bank in response to the reference voltage from the corresponding current copier circuits.

In this embodiment of the present invention, the current copier circuits can be arranged near corresponding sense amplification blocks.

Example current copier circuits can include: a first PMOS transistor having a source connected to a power voltage, and a gate and a drain that are commonly connected to a first node, wherein the first node is connected through a reference signal line to the reference cell array; a second PMOS transistor having a source connected to the power voltage, and a gate and drain that are commonly connected to a second node; a first amplifier for generating the reference voltage by comparing a voltage of the first node voltage with a voltage of the second node voltage; and a first NMOS transistor connected between the second node and a ground voltage, and controlled by the reference voltage.

Example sense amplifiers of each sense amplification block can include: a main sense node; a reference sense node; a first PMOS transistor for supplying a predetermined current to the main sense node; a second PMOS transistor for supplying a predetermined current to the reference sense node; a second NMOS transistor for discharging current supplied to the reference sense node in response to a reference voltage from the corresponding current copier circuits; and a second amplifier for outputting data by comparing a voltage of the reference sense node with a voltage of the main sense node.

Example sense amplifiers further include third and fourth NMOS transistors which are connected to the main sense node and the reference sense node, respectively, are operated in response to a discharge signal. The first and second NMOS transistors are formed in a first guard band connected to a first ground line. The third and fourth NMOS transistors are formed in a second guard band connected to a second ground line.

In another embodiment of the invention, a semiconductor memory device includes: a reference cell array; a plurality of banks including memory cells, respectively; a plurality of current copier circuits, each corresponding to the banks, that copy reference currents through the reference cell array to generate reference voltages; and a plurality of sense amplification blocks each corresponding to the banks and including a plurality of sense amplifiers for sensing data from a corresponding bank in response to reference voltages from the corresponding current copier.

The memory cells can store multi-bit data. An example reference cell array includes first, second and third memory cells to be designed to have different threshold voltages. Each of the current copier circuits includes first, second, and third current copiers which generate first, second, and third reference voltages by copying current flowing through the first to third reference memory cells.

Example first, second, and third current copiers include: a first PMOS transistor having a source connected to a power voltage, and a gate and a drain that are commonly connected to a first node, wherein the first node is connected through a corresponding reference signal line to the reference cell array; a second PMOS transistor having a source connected to the power voltage, a gate connected to a gate of the PMOS transistor, and a drain connected to the second node; a first amplifier generating a corresponding reference voltage by comparing a voltage of the first node and a voltage of the second node; and a first NMOS transistor connected between the second node and a ground voltage and controlled by the corresponding reference voltage.

Example sense amplifiers of each sense amplification block can include: a main sense node; a reference sense node; a first PMOS transistor for supplying a predetermined current to the main sense node; a second PMOS transistor for supplying a predetermined current to the reference sense node; a third PMOS transistor connected through a second NMOS transistor to the reference sense node for discharging currents supplied to the reference sense node in response to a first reference voltage from a first current copier of a corresponding current copier circuit; a fifth PMOS transistor connected through a fourth NMOS transistor to the reference sense node for discharging currents supplied to the reference sense node in response to a second reference voltage from a second current copier of the corresponding current copier circuit; a seventh PMOS transistor connected through a sixth NMOS transistor to the reference sense node for discharging currents supplied to the reference sense node in response to a third reference voltage from a third current copier of the corresponding current copier circuit; and a second amplifier outputting data by comparing a voltage of the reference sense node and a voltage of the main sense node.

According to still another embodiment of the present invention, a semiconductor memory device includes: a reference cell array; a first sector and a second sector each including memory cells respectively arranged in a matrix format of rows and columns; a first global bit line and a second global bit line arranged through the first and second sectors; a column gate selection circuit for connecting the first global bit line to a memory cell of the first sector and the second global bit line into a memory cell of the second sector in response to selection signals; a current copier circuit for generating a reference voltage by copying currents flowing through the reference cell array; a sense amplification circuit having a main sense node and a reference sense node, for comparing a voltage of the main sense node with a voltage of the reference sense node in response to the reference voltage to output data; and a switch circuit for connecting a selected one of the first and second global bit lines to the main sense node and a unselected global bit line to the reference sense node. Any one of the memory cells connected to the first and second global bit lines is only conducted.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A semiconductor memory device comprising:
   an amplifier having a first and a second input terminal;
   a memory cell electrically connected to the second input terminal;
   a first switch configured to discharge the first input terminal;
   a second switch configured to discharge the second input terminal; and
   a third switch configured to discharge the first input terminal in response to a reference voltage,
   wherein the first and second switches are formed in a first circuit region that is defined by a first guard band connected to a first ground line; and
   wherein the third switch is formed in a second circuit region that is defined by a second guard band connected to a second ground line.

2. The semiconductor memory device of claim 1, wherein the first ground line and the second ground line are electrically isolated from each other.

3. The semiconductor memory device of claim 1, wherein the first switch comprises a first NMOS transistor connected between the first input terminal and the first ground line controlled by a first control signal, and the second switch comprises a second NMOS transistor connected between the second input terminal and the first ground line controlled by the first control signal.

4. The semiconductor memory device of claim 3, wherein the third switch comprises a third NMOS transistor and a fourth NMOS transistor connected in series between the first input terminal and the second ground line, the third NMOS transistor being controlled by a second control signal and the fourth NMOS transistor being controlled by the reference voltage.

5. The semiconductor memory device of claim 1, further comprising:

a current source configured to supply a current to the first and second input terminals.

6. The semiconductor memory device of claim 1, further comprising:
a reference current generator circuit for generating a reference current; and
a current copier for copying the reference current to generate the reference voltage, the current copier having a discharge transistor connected to the second ground line.

* * * * *